(12) United States Patent
Masuda et al.

(10) Patent No.: US 7,459,860 B2
(45) Date of Patent: Dec. 2, 2008

(54) ORGANIC ELECTROLUMINESCENCE ELEMENT AND METHOD FOR DRIVING THE ELEMENT

(75) Inventors: Tsuyoshi Masuda, 3740, Shinyamanoi, Sanyo Onoda-shi, Yamaguchi-ken (JP); Tadaoki Mitani, 1-50-A-34, Asahidai, Nomi-shi, Ishikawa-ken (JP); John Rennie, Komae (JP); Kounosuke Uozumi, Kanazawa (JP)

(73) Assignees: Japan Science and Technology Agency, Kawaguchi-shi, Saitama (JP); Tsuyoshi Masuda, Onda-shi, Yamaguchi (JP); Tadaoki Mitani, Nomi-shi, Ishikawa (JP); Komatsu Seiren Co., Ltd., Nomi-shi, Ishikawa (JP)

( * ) Notice: Subject to any disclaimer, the term of this patent is extended or adjusted under 35 U.S.C. 154(b) by 196 days.

(21) Appl. No.: 11/628,862

(22) PCT Filed: Jun. 10, 2005

(86) PCT No.: PCT/JP2005/010657

§ 371 (c)(1),
(2), (4) Date: Jan. 17, 2007

(87) PCT Pub. No.: WO2005/122648

PCT Pub. Date: Dec. 22, 2005

(65) Prior Publication Data

US 2008/0042582 A1   Feb. 21, 2008

(30) Foreign Application Priority Data

Jun. 11, 2004   (JP)   ............... 2004-174859

(51) Int. Cl.
*H05B 33/08* (2006.01)
*H01J 1/62* (2006.01)

(52) U.S. Cl. .................... 315/169.3; 313/504

(58) Field of Classification Search ............... 313/494, 313/495, 497, 498, 499, 500, 504, 505, 506; 315/196.3, 196.4
See application file for complete search history.

(56) References Cited

U.S. PATENT DOCUMENTS 5,552,678 A * 9/1996 Tang et al. ............... 315/169.3
6,414,431 B1 * 7/2002 Yu et al. ...................... 313/504
6,630,793 B2 * 10/2003 Rubner et al. ............ 315/169.1

* cited by examiner

*Primary Examiner*—David Hung Vu
(74) *Attorney, Agent, or Firm*—Manabu Kanesaka

(57) ABSTRACT

An organic electroluminescence element having a thin film of organic compound containing at least a light-emitting layer interposed between an anode and a cathode is disclosed. This element is driven by utilizing the sheet resistance of the anode or the cathode in a manner such that the distribution of brightness or color in a single light-emitting plane is modulated with the elapse of time. For example, at least either of the anode and the cathode is furnished with not less than two connecting parts, voltages are applied severally to the connecting parts, and at least one of the factors, i.e. amplitude, frequency, phase, and offset of the voltage applied to each of the connecting parts is modulated. As a result, a completely novel organic electroluminescence element that is capable of causing the brightness and the color to be so modulated as to induce waving in a single light-emitting plane can be realized.

11 Claims, 8 Drawing Sheets

Fig..1

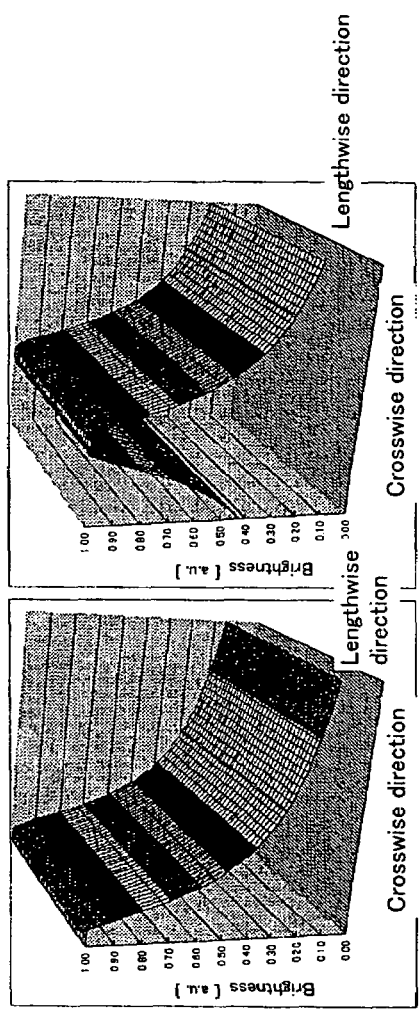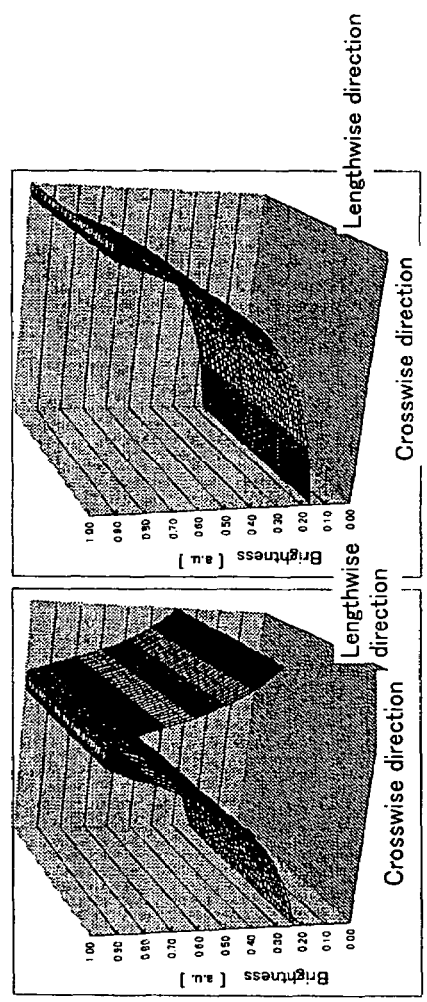

Fig. 9 (a)
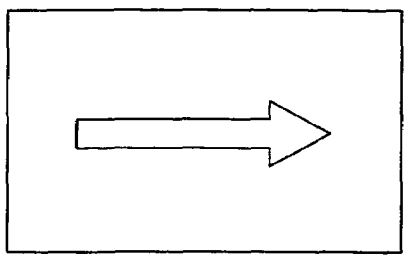 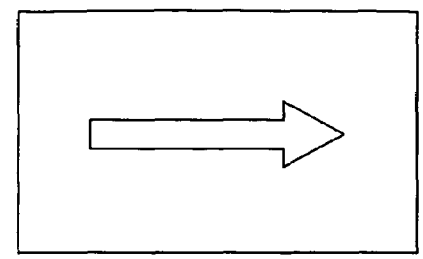
EL1    EL2
Fig. 9 (b)
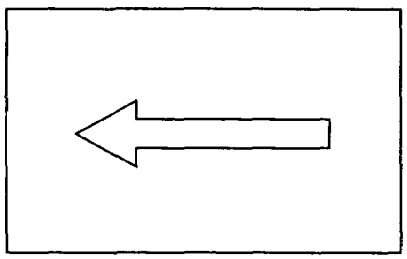 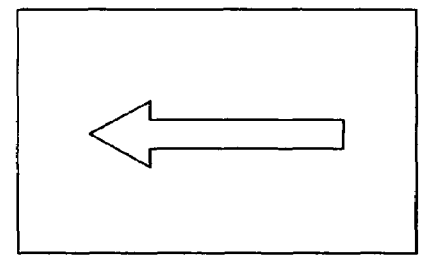
EL1    EL2
Fig. 9 (c)
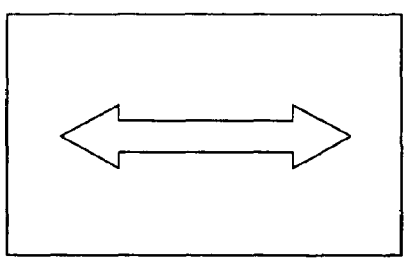 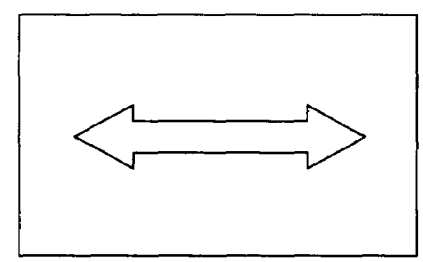
EL1    EL2 ically, this invention is aimed at providing a perfectly novel organic
ORGANIC ELECTROLUMINESCENCE ELEMENT AND METHOD FOR DRIVING THE ELEMENT

TECHNICAL FIELD

This invention relates to a self-luminous type organic electroluminescence element and a method for driving the element, and particularly to a completely novel driving technique for realizing emission of light allowing luminous distribution and color distribution temporally in a single light-emitting plane of an organic electroluminescence element with such a large area as is used for illumination, for example.

BACKGROUND ART

The organic electroluminescence element (hereinafter referred to as "organic EL element") is a self-luminous type planar light source. Since it produces rapid response, enjoys the advantage of avoiding dependence on the angular field of view, and allows relatively easy addition to dimension and flexibility of the elemental area, it is expected to find a wide range of applications in lighting units and displays.

As the configuration of the organic EL element, the product obtained by forming a transparent electrode (anode) made of indium tin oxide (ITO) on a transparent glass substrate, for example, and superposing thereon a hole injection layer, a hole transfer layer, a light-emitting layer, an electron transfer layer, an electron injection layer, and a cathode by the vacuum deposition method, for example, has been known. In the organic EL element of this configuration, when a DV voltage is applied between the transparent electrode which is an anode and the cathode, the hole (electron hole) injected from the transparent electrode via the hole injection layer is moved via the hole transfer layer to the light-emitting layer while the electron injected from the cathode via the electron injection layer is moved via the electron transfer layer to the light-emitting layer and, in the light-emitting layer, the electron-hole pairs are recombined. As a result, the light of a prescribed wavelength is generated and this light is observed from the transparent glass substrate side.

Incidentally, when the organic EL element mentioned above is intended to effect temporal modulation of brightness within a prescribed image plane with a view to attaining an effect of visual sense, for example, it is generally required to adopt a configuration proper for a display device similarly to various kinds of display. In a display having light-emitting elements arrayed in the pattern of a matrix, for example, when the picture elements in each vertical line are equalized in brightness, the individual lines are so adjusted that they sequentially grow in brightness from right to left in the image plane, and the display is scrolled from left to right at a certain frequency, the image plane appears to be waving. The display of this behavior cannot be realized unless it is furnished with a display panel having picture elements (light-emitting elements) innumerably arrayed and a control device composed of a driver IC and a CPU that are capable of enabling the individual picture elements to emit light with accurate brightness at a proper timing.

As displays using an organic EL element, various methods of display as disclosed in JP-A 2003-76324 and JP-A 2002-91377, for example, have been known. These methods, however, invariably necessitate their picture elements severally possessing a configuration proper for an organic EL element to be arrayed in the pattern of a matrix and indispensably require a scanning line and a signal wire serving in conformity with these signal elements, a switching element, and driving circuits for driving and controlling them.

DISCLOSURE OF THE INVENTION

Problems to be Solved by the Invention

Manufacture of the display panel and the control device mentioned above call for enormous time and cost. In the illuminating device, for example, the adoption of the same configuration as that for the display device in an effort to effect brightness modulation with the object of attaining an effect of some visual sense is not quite realistic.

In recent years, the illuminating devices for decoration and the auxiliary illuminating devices for interior decoration have been demanding illuminations that possess conceptual individuality instead of standardized design prevalent heretofore besides not only the function as a simple light source but also such additive values as light controlling function and maintenance property. When a simple configuration allowing for modulating brightness and color is developed, it can produce a fantastic visual effect and is expected to make greater demands.

Means for Solving the Problem

This invention has been proposed in view of the true state of affairs of the prior art described above. Specifically, this invention is aimed at providing a perfectly novel organic electroluminescence element capable of modulating brightness and modulating color so as to induce waving, for example, on the light-emitting plane without requiring a display panel having picture elements (light-emitting elements) arrayed in the pattern of a matrix, a driving circuit calling for a complicated circuit configuration, or a control device. It is also aimed at providing an illumination device and a decorative device that result from applying the organic electroluminescence element. It is further aimed at providing a method for driving the organic electroluminescence element capable of realizing the modulation of brightness and modulation of color mentioned above with a simple circuit configuration.

The present inventors have pursued various studies over a long period with a view to accomplishing the object described above. As a result, they have acquired a conclusion that in an organic EL element whose light-emitting plane has a considerably large area, the values of resistance of the electrodes (anode and cathode) cause the applied voltage to vary with the distance from the connecting part and the use of this variation enables the modulation of brightness and the modulation of color.

This invention has been derived from the totally novel concept that differs from the prior art. Specifically, the organic electroluminescence element of this invention is such an organic electroluminescence element that a thin film of organic compound containing at least a light-emitting layer is interposed between an anode and a cathode, the anode and the cathode are caused to constitute planar electrodes and enabled to form a light-emitting plane having a prescribed area. It is characterized by the fact that at least either of the anode and the cathode constituting the planar electrodes is connected via at least two connecting parts to a power source and driving voltages having mutually different waveforms are applied to at least part of these connecting parts. Then, the illuminating device and the decorating device contemplated by this invention are characterized by being provided with such an organic electroluminescence element as mentioned above.

The method for driving the organic electroluminescence element of this invention is a method for driving such an organic electroluminescence element that a thin film of organic compound containing at least a light-emitting layer is interposed between an anode and a cathode and the anode and the cathode are caused to constitute planar electrodes and enabled to form a light-emitting plane having a prescribed area. It is characterized by driving the organic electroluminescence element in such a manner that the brightness and/or the color passes through a different state of distribution within at least one light-emitting plane and the states of distribution of brightness and color in the light-emitting plane are modulated with the elapse of time.

In the organic EL element having a large light-emitting area, when the transparent electrode formed in a prescribed area as an anode under the thin film of organic compound possesses a prescribed value of resistance, no uniform voltage is applied within the light-emitting plane and the applied voltage is varied in accordance with the distance from the connecting part disposed on the transparent electrode. When the transparent electrode is finished with a plurality (not less than two) of connecting parts and driving voltages differing in effective voltage, frequency, phase, and the like are applied to these connecting parts, the driving voltages differing in pattern in conformity with the distances from the connecting parts are eventually applied. As a result, light emission possessing distributions of brightness and color is effected within the light-emitting plane. The state of distribution differing in brightness and color within one light-emitting plane such as having high brightness in a certain part and low brightness in another part within one light-emitting plane is realized. When the effective voltage, frequency, and phase mentioned above are appropriately controlled here, the state of distribution mentioned above is varied with time and the emission of light accompanied by a movement such as, for example, waving of the image plane is realized within one light-emitting plane.

In this invention, the emission of light accompanied by the movement mentioned above takes place within a single light-emitting plane. The organic EL element of this invention, therefore, is allowed to have the same configuration as the ordinary organic EL element used for illumination and is not required to have light-emitting elements arrayed in the pattern of a matrix like the display. Though the driving circuit is required to a certain extent for the purpose of controlling the drive voltage, a scanning line and a signal wire serving in conformity with these pixels, a switching element, and complicated driving circuits for driving and controlling them are not required.

Effect Of The Invention

By this invention, it is made possible to provide a completely novel organic electroluminescence element capable of modulating brightness and modulating color so as to induce waving, for example, on the light-emitting plane without requiring a display panel having picture elements (light-emitting elements) arrayed in the pattern of a matrix, a driving circuit calling for a complicated circuit configuration, or a control device and a method for driving the organic electroluminescence element. By applying this organic electroluminescence element, it is further made possible to provide an illumination device and a decorative device having high additive value

BRIEF DESCRIPTION OF THE DRAWINGS

FIG. 6 is a diagram showing temporally one example of the modulation of brightness resembling a waving.

FIG. 9 is a type section showing the behaviors of light emission on individual light-emitting planes in the example of connection shown in FIG. 8.

BEST MODE OF EMBODYING THE INVENTION

Now, the organic EL element embodying this invention and a method for driving the element will be explained in detail below by reference to the accompanying drawings.

This invention is ideally embodied in an organic EL element having such a large light-emitting area as exceeding 10 mm×10 mm (=100 mm$^2$) such as, for example, an organic EL element for use in illumination or decoration. This is because the modulation of brightness and the modulation of color within a single elemental area is meaningless from the viewpoint of visual sense for the organic EL element having such a small elemental area as the organic EL element for a display, the organic EL elements for use in illustration or decoration are required to heighten their additive values, and the modulation of brightness and the modulation of color are creating a great need. In the following modes of embodiment, therefore, large-area organic EL elements for illustration and decoration will be assumed for the sake of explanation.

Figure 1:
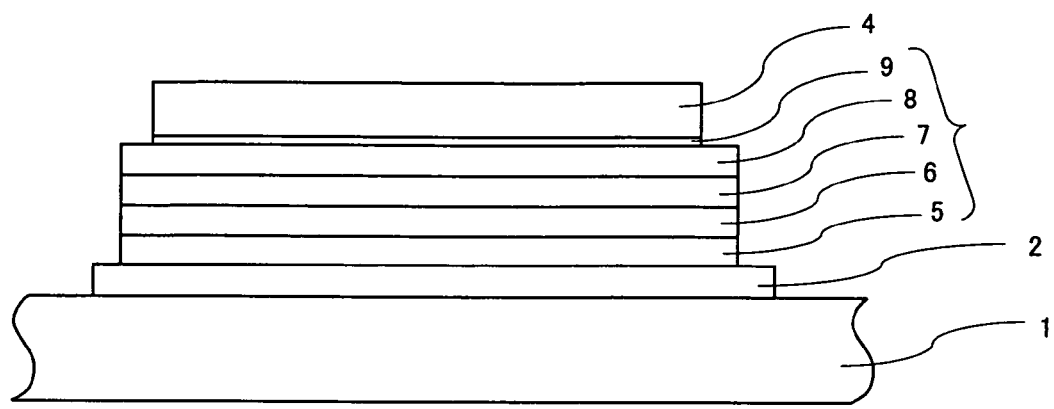
FIG. 1 is a schematic cross section showing the basic configuration o an organic EL element.

The basic configuration of the organic EL element of this invention is not different in any point from the ordinary organic EL element. It has the element part thereof configured by sequentially stacking a transparent electrode 2 functioning as an anode, a thin film 3 of organic compound, and a cathode 4 in the order mentioned on a substrate 1 as shown in FIG. 1, for example.

The substrate 1 functions as a barrier layer for intercepting the invasion of the element part by moisture and oxygen besides functioning as a base material for supporting the element part. The material of which the substrate 1 is made is not particularly limited. When the organic EL element happens to be of the bottom emission type, for example, the material prefers to be transparent because the emitted light is extracted via the substrate 1. Thus, glass or a plastic substance may be used as the material. Glass proves to be a preferable material because it excels in the barrier property against moisture and oxygen. When a plastic substance is used as the material, it sometimes proves to be deficient in the barrier property mentioned above. In this case, the substrate 1 prefers to have a barrier layer formed on the surface thereof.

The anode is formed on the substrate 1 mentioned above. When the organic EL element happens to be of the aforementioned bottom emission type, this anode also prefers to be transparent. The anode, therefore, is generally formed as a transparent electrode 2 formed of such an inorganic transparent electrically conductive material as indium tin oxide (ITO), for example.

The thin film 3 of organic compound is formed on the transparent electrode 2. The provision of at least a light-emitting layer suffices for the configuration of the organic EL element. The configuration may be a five-layer structure, for example, which consists of a hole injection layer 5, a hole transfer layer 6, a light-emitting layer 7, an electron transfer layer 8, and an electron injection layer 9. Of course, the configuration is not limited to this structure. The hole injection layer 5, the hole transfer layer 6, the electron transfer layer 8, and the electron injection layer 9 may be properly omitted.

The materials of which the individual layers are made are not particularly limited. They may be optionally selected from all the materials publicly known as available for the organic EL elements. For illustration, the materials available for the hole injection layer 5 include aryl-amines such as 4,4',4"-tris[N-(1-naphthyl)-N-phenylamino]-triphenylamine (TNATA) and TDATA, phthalocyanines such as copper phthalocyanine (CuPc), and Lewis acid-doped organic layers for example. The materials available for the hole transfer layer 6 include such arylamines as TPD, spiro-TPD, NPD, and TPAC for example.

The materials available for the light-emitting layer 7 include triarylamine derivatives, stilbene derivatives, polyarylene, aromatic condensation polycyclic compounds, aromatic complex condensation cyclic compounds, and metal complex compounds for example. Otherwise, the products resulting from adopting an aluminum complex ($Alq_3$) or a beryllium complex ($Bebq_2$) as a host material and causing the host material to be doped with a dopant pigment are usable. The dopant pigments available in this case include perylene, coumarin 6, quinacridone (Qd), lupulen, and DCM for example.

The materials available for the electron transfer layer 8 include aluminum complexes, oxadiazols, triazols, and phenanthrolines for example. The materials available for the electron injection layer 9 include alkali metals such as lithium, lithium fluoride, lithium oxide, lithium complexes, and alkali metal-doped organic materials for example.

The cathode 4 disposed on the thin film 3 of organic compound is formed of such a metallic material as aluminum or such an alloy material as aluminum-lithium alloy or magnesium-silver alloy, for example. The cathode 4 is formed by depositing such a metallic material or an alloy material in the form of a film by the vacuum thin-film forming technique such as, for example, sputtering or vapor deposition.

In this invention, the modulation of brightness and the modulation of color that cause the distribution of brightness and color to be temporally changed in a single light-emitting plane is realized by providing either or both of the transparent electrode 2 and the cathode 4 of the organic EL element of the configuration mentioned above with not less than two connecting parts to be connected to a power source and controlling the drive voltage to be applied to these connecting parts. In this case, the electrode provided with not less than two connecting parts prefers to possess a considerably high value of resistance. Specifically, the sheet resistance is preferably not less than 20 Ω/□. If the sheet resistance mentioned above is unduly low, the prescribed voltage difference will not be afforded and the modulation of brightness and the modulation of color in a visually discernible form will be attained only with difficulty.

Generally, the transparent electrode 2 formed of ITO proves to be an advantageous electrode that is fated to be provided with not less than two connecting parts mentioned above because it has a comparatively high sheet resistance. Since the cathode 4 is formed of a metal or an alloy of Al, for example, it reveals a small electric resistance and allows no easy modulation in an ordinary film thickness. When the cathode 4 is given a decreased film thickness and an increased value of resistance, however, it can be utilized as an electrode to be furnished with not less than two connecting parts similarly to the transparent electrode 2 mentioned above.

In the transparent electrode 2 and the cathode 4, the positions for disposing the connecting parts are optional so long as they part from each other. The connecting parts, however, are preferably disposed across a certain distance. When the square or rectangular light-emitting plane, for example, is expected to produce emission of light in a waving pattern, the connecting parts are preferably disposed outside the two mutually opposed sides of the square or rectangular light-emitting region.

Now, the principle of the modulation of brightness or the modulation of color taking place temporally in the organic EL element of the foregoing configuration will be explained below.

Figure 2:
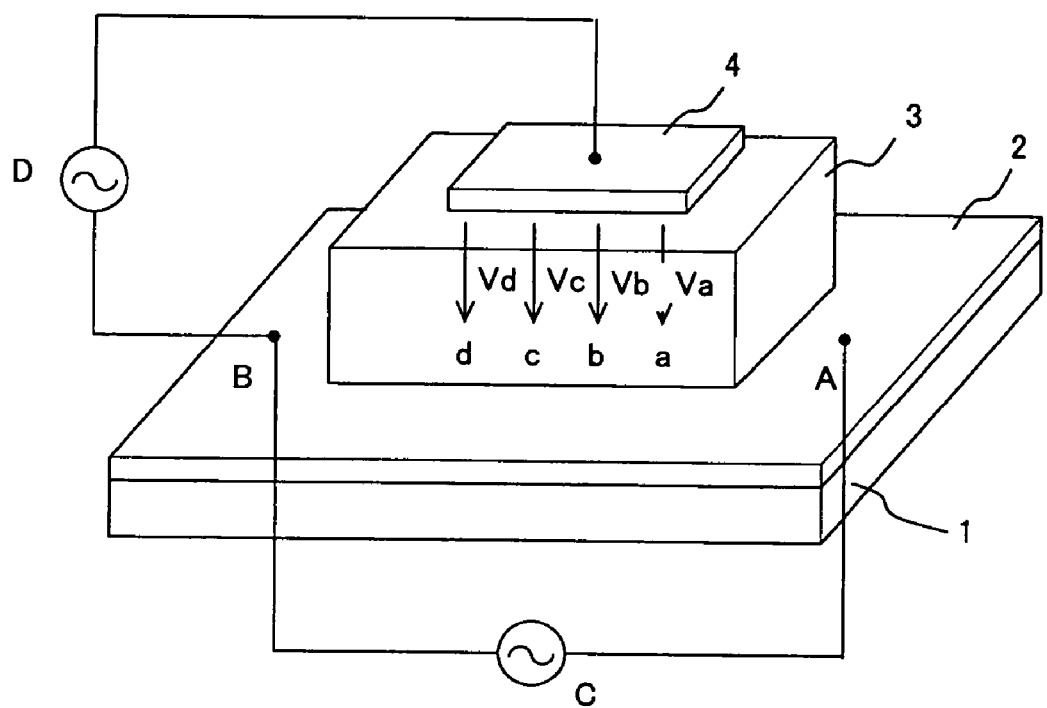
FIG. 2 is a type section for explaining the principle of this invention.

The configuration of the organic EL element results from stacking the transparent electrode 2 made of ITO, the thin film 3 of organic compound containing the light-emitting layer, and the cathode 4 made of Al, for example, on the substrate 1 as shown in FIG. 2. Here, the case of disposing connecting parts A and B on the opposite sides of the transparent electrode 2 across the thin film 3 of organic compound and connecting AC power sources C and D thereto as shown in the drawing and consequently driving a single light-emitting plane is assumed.

Figure 3:
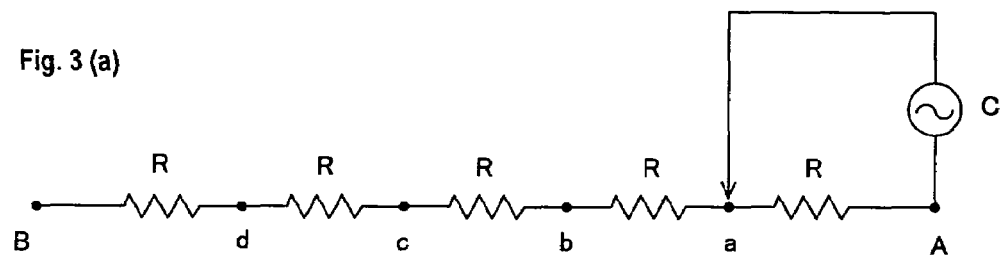
FIG. 3 is a drawing showing equivalent circuits at the points a to d in the region between the connecting parts.
Figure 3:
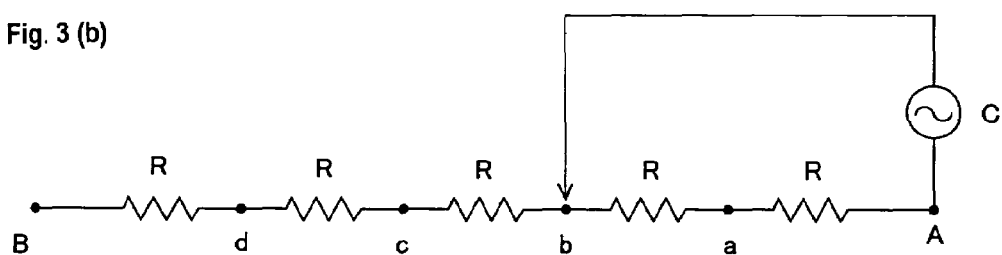
Figure 3:
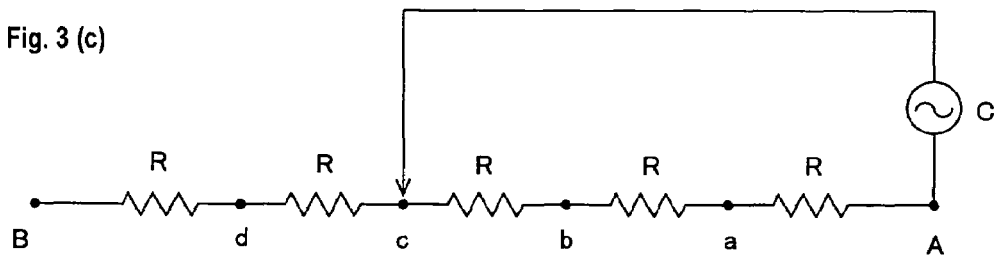
Figure 3:
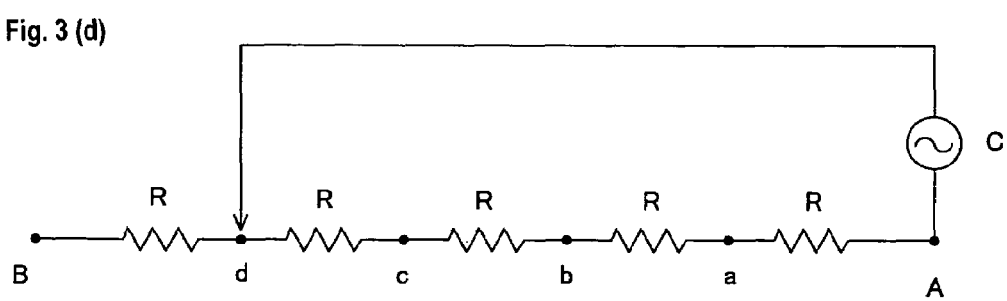

The transparent electrode 2 formed of ITO, for example, possesses a prescribed value of resistance as described above. A resistance R of an equal value severally occurs between the points, a to d, existing in the interval from the connecting part A to the connecting part B as shown in FIG. 3. In this case, the voltage of the AC power source connected to the connecting part A, for example, is eventually applied to the individual points a to d in such forms as shown in the equivalent circuits of FIG. 3 (a) to FIG. 3 (d). As a result, the voltages applied to the individual points a to d are fated to be varied with the distances from the connecting part A owing to the voltage drop caused by the relevant resistance R. Even when a voltage of V1 is applied to the connecting part A, for example, it is attenuated from Va to Vd in accordance as the distance from the connecting part A is increased. The same applies when the voltage applied by the AC power source C is fluctuated from V1 to −V1, namely the amplitude is large at the point a near the connecting part A and small at the point d far therefrom as indicated by the lines in FIG. 4.

Figure 4:
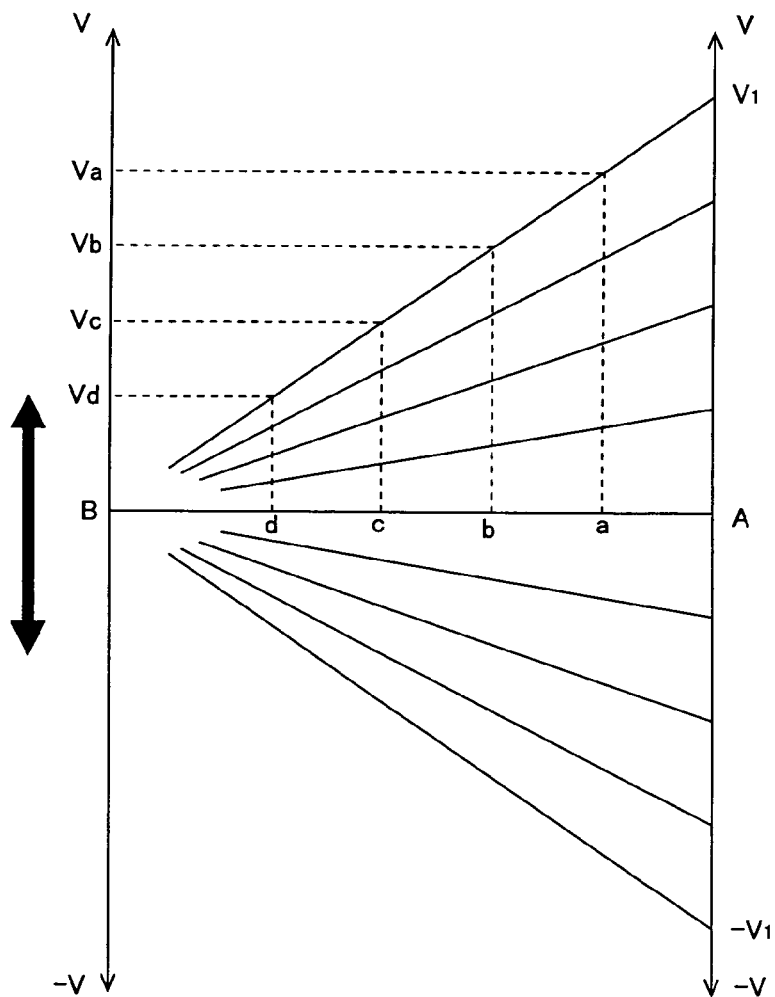
FIG. 4 is a characteristic diagram showing changes taking place in applied voltage in the regions between the connecting parts when a voltage is applied to the connecting part A.

The different amplitudes at the individual points result in inducing distribution of brightness. The appearance of this distribution of brightness may well be compared to the case of shaking a pencil with one end thereof used as a fulcrum. When the pencil is shaken at a certain speed with one end thereof as a fulcrum, it appears to be bent in the human eye. The same phenomenon as this occurs when the application of voltage is implemented as shown in FIG. 4. By applying an AC voltage of such a prescribed frequency as shown in FIG. 4 to the connecting part A and oscillating the potential of the connecting part B with prescribed amplitude and frequency as shown by the arrow mark in the drawing, the change of brightness in the interval from the connecting part A to the connecting part B is enabled to be observed as a smooth change of brightness owing to the influence of the after-image.

Figure 5:
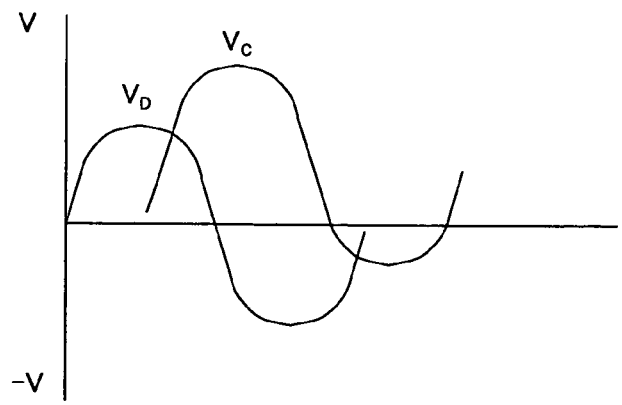
FIG. 5 is a waveform diagram showing one example of the voltages applied by power sources C and D.

The same applies to the connecting part B. By imparting a prescribed phase difference, for example, to the voltage $V_c$ applied by the power source C and the voltage $V_D$ applied by the power source D as shown in FIG. 5, therefore, the modulation of brightness inducing the image plane to move like a wave as shown in FIG. 6 can be realized. Referring to FIG. 6, first FIG. 6 (a) depicts that the brightness reaches the greatest height at the left terminal in the drawing and, as the voltages applied to the connecting parts A and B are gradually changed, the region having the highest degree of brightness is gradually shifted to the right side in the drawing as shown in FIG. 6 (b) and FIG. 6 (c). Further, the region of the highest degree of brightness shifts to the right end of the light-emitting plane as shown in FIG. 6 (d). On the opposite sides of the region having the highest degree of brightness, the brightness is gradually depressed with a prescribed gradation. This depression coupled with the series of movements of the region having the highest degree of brightness mentioned above leads to realization of the fantastic emission of light that induces the light to move like a wave in the whole image plane.

The waving of emitted light between the opposed two sides of the region of light emission has been explained by way of illustration. The modulation of brightness and the modulation of color are not limited to this example but may be altered variously. By having connecting parts disposed at three or more places, for example, it is made possible to realize modulation of brightness and modulation of color in more complicated forms. Then, by properly altering the voltages applied to the individual electrodes in amplitude, offset, mutual phase difference, and frequency, it is made possible to implement modulation of brightness and modulation of color in varying patterns. As the waveform of the drive voltage to be applied, the sine wave may be cited. Though the sine wave enables the modulation of brightness and the modulation of color to be implemented smoothly, the waveform does not need to be limited to the sine wave. The triangular wave and the rectangular wave may take the place of the sine wave.

Incidentally, when the modulation of color is particularly expected, it is fulfilled by having a plurality of light-emitting layers capable of emitting lights differing in color incorporated in the thin film of organic compound. At this time, by varying the voltage levels necessary for causing the individual light-emitting layers to emit their lights, the modulation of color can be realized by the same voltage drive as mentioned above.

Now, a concrete example of embodying this invention will be explained below. In the present example, organic EL elements were actually manufactured and tested for modulation of brightness and modulation of color with a view to conforming the effect of this invention.

Temporal Change of Brightness Distribution

Figure 7:
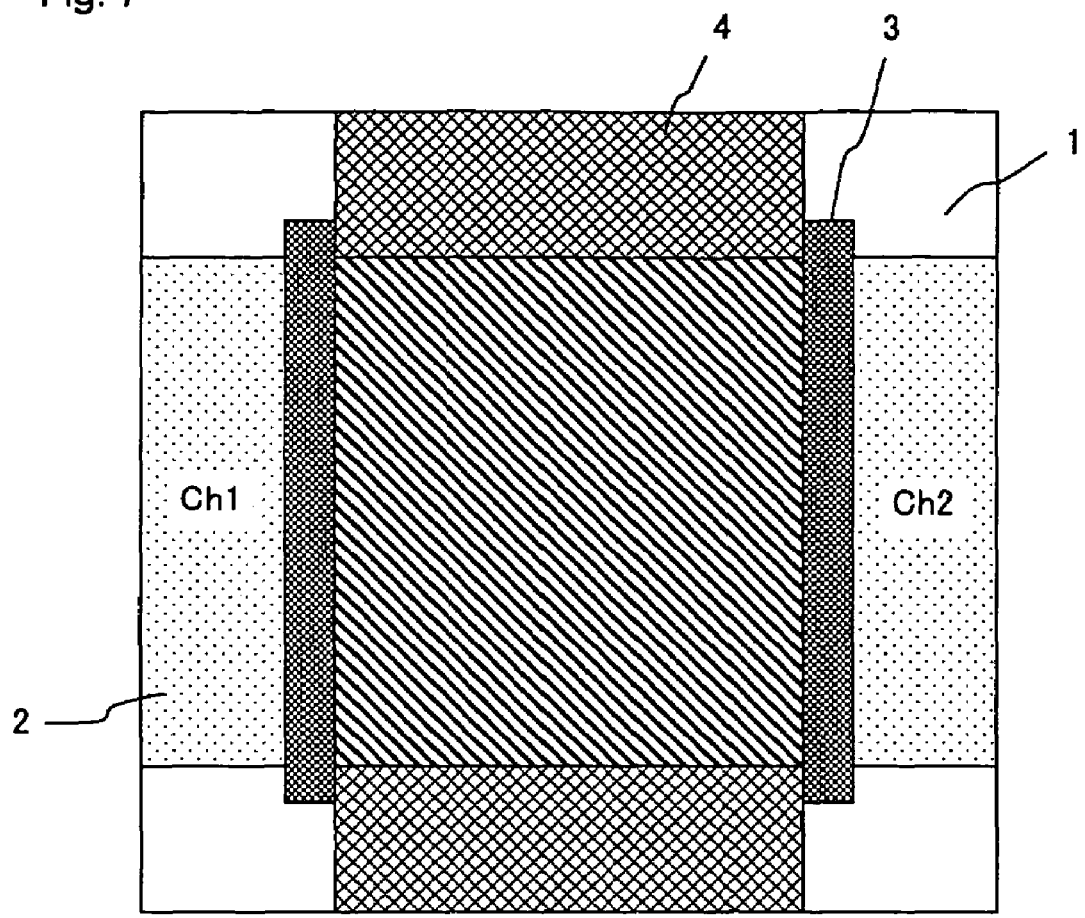
FIG. 7 is a schematic plan view showing an organic EL element manufactured in a working example.

For optimizing the drive condition, an organic EL element configured as shown in FIG. 7 was used. This organic EL element resulted from stacking a thin film 3 of organic compound and a cathode 4 made of Al on a glass substrate 1 having formed in advance thereon a transparent electrode 2 made of ITO. In the drawing, the region shaded with oblique lines constituted a light-emitting area. The substrate measured the square of 100 mm and the light-emitting area measured the square of 75 mm.

The thin film 3 of organic compound was in a four-layer structure of CuPc (200 Å)/α-NPD (300 Å)/Alq$_3$ (1000 Å)/LiF (10 Å). The cathode 4 formed of Al had a thickness of 800 Å. The component layers were severally deposited by the method of resistance heating. The organic EL element was sealed with a glass cap.

The organic EL element was operated in the drive pattern 1 to drive pattern 4 shown in Table 1 below to determine the temporal change of the distribution of brightness in the organic EL element. During this operation, the voltage of the cathode 4 was fixed at 0 V. The opposite terminals of the light-emitting area of the transparent electrode 2 serving as an anode were denoted as Ch1 and Ch2. A voltage of a sine waveform was applied severally to these terminals. Formerly, the temporal change of the distribution of brightness was compared to the phenomenon that a pencil, when shaken, appeared in a bent form. According to this phenomenon, Ch1 constituted the fulcrum for supporting the pencil and Ch2 constituted the pencil point. The factors of the movements of the fulcrum and the pencil point (frequency and amplitude) correspond to the parameters shown in Table 1.

TABLE 1

|  |  | Drive pattern 1 | Drive pattern 2 | Drive pattern 3 | Drive pattern 4 |
| --- | --- | --- | --- | --- | --- |
| Ch 1 | Amplitude | 5 V | 5 V | 5 V | 5 V |
|  | Offset voltage | 10 V | 10 V | 10 V | 10 V |
|  | Frequency | 0.5 Hz | 0.5 Hz | 0.5 Hz | 0.5 Hz |
| Ch 2 | Amplitude | 0 V | 0 V | 20 V | 20 V |
|  | Offset voltage | 0 V | 10 V | −2 V | 18 V |
|  | Frequency | 0.5 Hz | 0.5 Hz | 0.5 Hz | 0.5 Hz |
| Phase difference between Ch 1 and Ch 2 |  | 0° | 0° | 290° | 290° |

(1) Drive Pattern 1

In the drive pattern 1, the blinking display was produced to repeat lights-on and lights-out literally on the whole image plane. At this time, the light and shade could be clarified by adding to the amplitude of Ch 1.

(2) Drive Pattern 2

In the drive pattern 2, the display resembling the bar display observed in the audio device was realized. On the Ch 1 side during the continuous lighting, one line drawn vertically moved right and left (Ch 1⇔Ch 2). The brightness on the Ch 1 electrode side could be lowered and the movement thereof sharpened by adding to the offset of Ch 2.

(3) Drive Pattern 3

In the drive pattern 3, the image in which the wave expressed by the gradient of brightness washed the shore from left to right (right to left) was realized. The brightness was increased and the aftereffect thereof was deepened in consequence of widening the amplitude of Ch 2. The movement of the wave was closely related to the parameters of Ch 1 and Ch 2. Whenever the parameters were altered, the phase difference also required adjustment. In the case of the parameters inherent in the present drive pattern, the wave dashing from left to right reached the Ch 1 side and induced total lights-on. Subsequently the brightness depressed from left to right and brought total lights-out. The direction of advance of the wave was reversed when the phase difference between Ch 1 and Ch 2 was ±90°.

(4) Drive Pattern 4

In the drive pattern 4 similarly to the foregoing drive pattern 3, the image in which the wave expressed by the gradient of brightness washed the shore was realized. In the case of the present drive parameters, however, the brightness on the Ch 1 side began to depress at the same time that the wave dashing from left to right reached the Ch 2 side and eventually vanished from left to right at the same speed as the wave in the dashing motion. Similarly to the case of the foregoing drive pattern 3, the direction of advance of the wave was reversed when the phase difference between Ch 1 and Ch 2 was ±90°.

By manipulating the parameters of the sine waveform as described above, it was made possible to induce a varying display, namely the temporal change of the distribution of brightness. Incidentally, the waveform of the voltage to be applied is not limited to the sine wave but may be a triangular wave or a rectangular wave. The display, however, becomes peculiar in conformity with the waveform to be applied. When the sign wave is used, the temporal change of the distribution of brightness is particularly smooth. This fact proves effective when the organic EL is used for the interior illumination, etc.

Though the frequency is simply fixed for the purpose of facilitating explanation of the basic display in the present example, it may be altered without inducing any inconvenience. When the frequencies of Ch 1 and Ch 2 are equally increased, for example, the display of wave allows addition to the speed of waving. When the frequencies of Ch 1 and Ch 2 are given different values, the blinking, the bar display, and the display of wave appear irregularly.

While the display utilizing the electric resistance of the ITO electrode (transparent electrode 2) has been explained in the present example, it is likewise permissible to implement display by utilizing the electric resistance of the A electrode (cathode 4). In this case, the ITO electrode is fixed at 0 V and the offset of the sine wave voltage to be applied is compelled to assume a negative voltage. It is further permissible to apply sine wave voltages simultaneously to the ITO electrode side and the Al electrode side. In this case, the waves generated in the horizontal direction and the vertical direction overlap, a fact that allows the viewer to enjoy more complicated and interesting temporal change of the brightness distribution.

Concrete Example of the Case of Using In-Plane Terminals at Two Places

Figure 8:
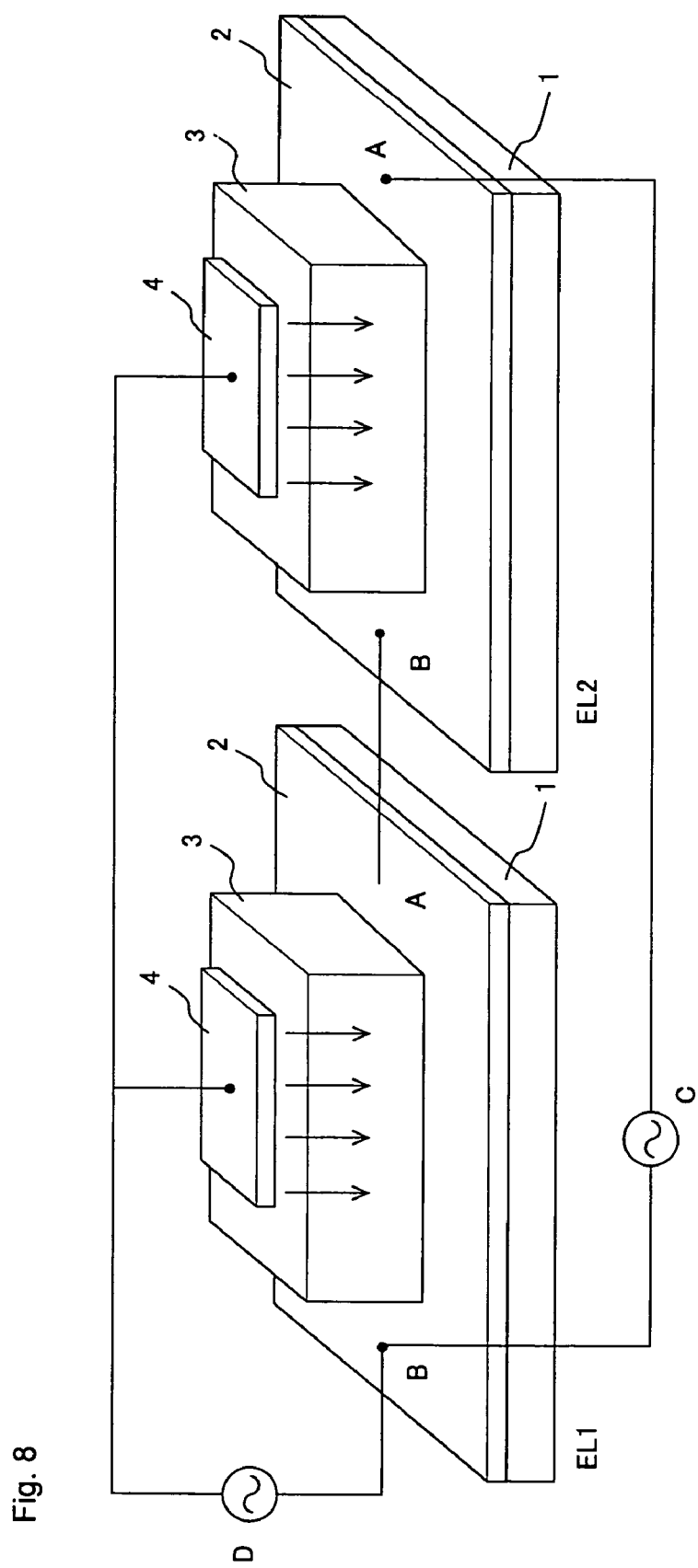
FIG. 8 is a schematic perspective view showing an example of connection of the organic EL element (number of in-plane terminals 2) manufactured in a working example.

In this example, the organic EL element illustrated in FIG. 2 was used as a light-emitting unit and two such organic EL elements were connected and driven by way of trial. The state of connection of the two organic EL elements is shown in FIG. 8. The configuration of each of the two organic EL elements was the same as shown in the foregoing FIG. 2. In the present drawing, therefore, the component elements identical with or equivalent to those shown in FIG. 2 are denoted by identical reference numerals and will be omitted from the following explanation.

The organic EL elements in the foregoing structure of connection were subjected to application of drive voltage under the following driving condition with the object of trying emission of light.

Driving Condition

Waveform applied to cathode—anode (waveform of drive voltage applied by AC power source D): Sine wave (amplitude: 10 V, offset: 5 V, frequency 2 Hz)

Waveform applied between A-B (waveform of drive voltage applied by AC power source C): Sine wave (amplitude: 6 V, offset: 0 V, frequency 1 Hz)

Phase difference between waveforms of drive voltages applied by AC power source C and AC power source D: 120 degrees As a result, the organic EL elements (EL 1 and EL 2) materialized light emissions in varying patterns as shown in FIG. 9 (*a*) to (*c*). In FIG. (*a*) to (*c*), the arrow marks indicate the directions of movement of the regions of light emission with high brightness. To be specific, the organic EL elements EL 1 and EL 2, the regions of light emission with high brightness moved from left to right as shown in FIG. 9 (*a*) and in the organic EL elements EL 1 and EL 2, the regions of light emission with high brightness moved from right to left as shown in FIG. 9 (*b*). The behaviors were thus varied. Further, the organic EL elements EL 1 and EL 2 showed a behavior such that the regions of light emission with high brightness produced a left-right reciprocating motion as shown in FIG. 9 (*c*). The behavior was observed to vary numerously, synchronizing between the organic EL element EL 1 and the organic El element EL 2, depending on prevalent timing, or slightly deviating therebetween.

Temporal Change of Distribution of Color

Here, the distribution of color was expressed within the light-emitting area and it was modulated by way of trial. The organic EL element manufactured herein had a substrate measuring the square of 50 mm and a light-emitting area measuring 20 mm×30 mm. The thin film 3 of organic compound was in a six-layer structure of CuPc (200 Å)/α-NPD (300 Å)/perilene 1%-doped CBP (200 Å)/rubrene 1%-doped Alq$_3$ (200 Å)/Alq$_3$ (100 Å)/LiF (10 Å). The cathode 4 made of Al was given a thickness of 2000 Å. The individual layers were deposited by the method of resistance heating. The organic EL element thus manufactured was sealed by using a glass cap.

The color distribution may be evaluated under the same drive condition as in the foregoing temporal change of the brightness distribution because the change of color is decided by the magnitude of the applied voltage. When the applied voltage was low, the perilene near the hole transfer layer (α-NPD) emitted light in a blue color. As the voltage increased, the rubrene also began to emit light in a yellow color and the emitted light, when observed from the glass surface, was found to be in the color of the mixture of a blue color and a yellow color. When the display was implemented by the drive pattern 1 mentioned above, the rubrene emitted light most when the applied voltage was maximized (amplitude of Ch 1/2+offset voltage+amplitude of Ch 1/1+offset voltage=20.5 V Max) and assumed a pastel yellow near (0.27 and 0.38) in the CIE colorimeter coordinates. When the voltage was low, only perilene emitted light in a blue color near (0.22 and 0.40) in the CIE colorimeter coordinates. Thus, the change of color by the applied voltage did not linearly move simply between the two points mentioned above but was observed to form a mixed color between the coordinates of the two points. Since the color of the emitted light was varied by the concentration of the dopant and the film thickness of the element (influence of the optical resonator structure), these factors were required to be properly set in conformity with the expected change of color.

The invention claimed is:

1. An organic electroluminescence element having a thin film of organic compound containing at least a light-emitting layer interposed between an anode and a cathode and causing the anode and the cathode to form planar electrodes forming light-emitting planes having a prescribed area, the organic electroluminescence element characterized by the fact that at least either of the anode and the cathode constituting the planar electrodes are connected via not less than two connecting parts to a power source and drive voltages differing in waveform are applied to at least part of these connecting parts.

2. An organic electroluminescence element according to claim 1, wherein the element is driven by the application of the drive voltages different in waveform in such a manner that the brightness and/or the color passes through the state of different distribution and the state of distribution of brightness and color within the light-emitting plane is modulated with the elapse of time.

3. An organic electroluminescence element according to claim 1 wherein the planar electrodes connected via the two or more connecting parts to the power source have a sheet resistance of not less than 20 Ω/□.

4. An organic electroluminescence element according to claim 1 wherein the anode is made of indium tin oxide and formed as a planar electrode having a sheet resistance of not less than 20 Ω/☐ and connecting parts are formed at two places of the anode.

5. An organic electroluminescence element according to claim 1, where one light-emitting plane has a size of not less than 10 mm×10 mm.

6. An illuminating device characterized by being furnished with the organic electroluminescence element set forth in claim 1.

7. A decorative device characterized by being furnished with the organic electroluminescence element set forth in claim 1.

8. A method for driving an organic electroluminescence element having a thin film of organic compound containing at least a light-emitting layer interposed between an anode and a cathode and causing the anode and the cathode to form planar electrodes forming light-emitting planes having a prescribed area, the method characterized by driving the element in a manner such that the brightness and/or the color passes through the state of different distribution in at least one light-emitting plane and the state of distribution of brightness and color in the light-emitting plane is modulated with the elapse of time.

9. A method according to claim 8, wherein at least either of the anode and the cathode made to form planar electrodes is connected via not less than two connecting parts to a power source and drive voltages mutually differing in waveform are applied to at least part of the connecting parts.

10. A method according to claim 9, wherein the drive voltages mutually different in waveform are mutually different in at least one of the factors, i.e. amplitude, frequency, phase, and offset of the applied voltage.

11. A method according to claim 10, wherein the drive voltages mutually different in waveform are drive voltages of the sine waveform mutually differing in phase.

* * * * *